United States Patent
Stamper et al.

(10) Patent No.: US 6,331,481 B1
(45) Date of Patent: Dec. 18, 2001

(54) DAMASCENE ETCHBACK FOR LOW $\epsilon$ DIELECTRIC

(75) Inventors: Anthony K. Stamper, Williston, VT (US); Vincent J. McGahay, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/225,477

(22) Filed: Jan. 4, 1999

(51) Int. Cl.[7] .................................................. H01L 21/441
(52) U.S. Cl. ........................ 438/626; 438/622; 438/624; 438/633; 438/638; 438/700
(58) Field of Search ...................... 438/622, 623, 438/624, 625, 626, 631, 700, 778, 633; 257/774, 751, 752, 762, 763

(56) References Cited

U.S. PATENT DOCUMENTS

| | | |
|---|---|---|
| 4,029,562 | 6/1977 | Feng et al. . |
| 4,541,168 | 9/1985 | Calie et al. . |
| 4,545,852 | 10/1985 | Barton . |
| 4,758,306 | 7/1988 | Cronin et al. . |
| 5,015,594 | 5/1991 | Chu et al. . |
| 5,103,288 | 4/1992 | Sakamoto et al. . |
| 5,266,446 | 11/1993 | Chang et al. . |
| 5,530,293 | 6/1996 | Cohen et al. . |
| 5,548,159 | 8/1996 | Jeng . |
| 5,550,405 | 8/1996 | Cheung et al. . |
| 5,559,055 * | 9/1996 | Chang et al. ................. 437/195 |
| 5,559,367 | 9/1996 | Cohen et al. . |
| 5,616,959 | 4/1997 | Jeng . |
| 5,625,232 | 4/1997 | Numata et al. . |
| 5,635,423 | 6/1997 | Huang et al. . |
| 5,641,712 | 6/1997 | Grivna et al. . |
| 5,654,589 | 8/1997 | Huang et al. . |
| 5,679,608 * | 10/1997 | Cheung ............................. 437/195 |
| 5,854,131 * | 12/1998 | Dawson et al. .................. 438/666 |
| 5,880,018 * | 3/1999 | Boeck et al. ..................... 438/619 |
| 5,977,241 * | 11/1999 | Koloski et al. .................. 524/502 |
| 5,998,303 * | 12/1999 | Sato .................................. 438/758 |
| 6,017,814 * | 1/2000 | Grill .................................. 438/619 |
| 6,028,362 * | 2/2000 | Omura et al. .................... 257/774 |
| 6,069,069 * | 5/2000 | Chooi ................................ 438/634 |
| 6,083,842 * | 7/2000 | Cheung ............................ 438/706 |
| 6,143,646 * | 11/2000 | Wetzel ............................. 438/637 |
| 6,159,845 * | 12/2000 | Yew ................................. 438/637 |

OTHER PUBLICATIONS

IBM TDB V13, No. 2, Jul. 1970, O. Bilous, et al., Multilevel Wiring for Integrated Circuits, pp. 4.
IBM TDM V29, No. 11, Apr. 1987, H.W. Huang, Refractory Contact Stud, pp. 5091–92.
IBM TDB, V14, No. 1, Jun., 1971; A.P. David, et al., Producing Integral Via and Pad Metallurgy, p. 101.
IBM TDB. V29, No. 11, Apr., 1987; G.A. Brooks, et al. One–Step Etchback, pp. 4890–4892.
IBM TDB, V33, No. 7, Dec., 1990; R.E. Burger, et al. Process for Simultaneously Forming Poly/EPI Silicon Filled Deep and Shallow Isolation Trenches Having a CVD Oxide Cap, pp. 388–392.
IBM TDB, V23, No. 4, Sep., 1980;J.R. Kitcher, Integral Stud for Multilevel Metal, p. 1395.
Electrochemical Society, V138, No. 11, Nov., 1991,Chemical–Mechanical Polishing for Fabricating Patterned W Metal Features as Chip Interconnects, Kaufman, et al. pp. 3460–3465.

* cited by examiner

*Primary Examiner*—Mary Wilczewski
*Assistant Examiner*—David J Goodwin
(74) *Attorney, Agent, or Firm*—Scully, Scott, Murphy & Presser; Howard J. Walter

(57) ABSTRACT

The present invention relates to a method of integrating a low dielectric material such as DLC into a dual or single damascene wiring structure which contains a dielectric material having a dielectric constant of 4.0 or above. This integration is achieved in the present invention by employing a step of etchingback the high dielectric constant material to expose regions of in-laid wiring present in the single or dual damascene structure. Damascene wiring structures, single or dual, prepared using the method of the present invention are also provided herein.

47 Claims, 14 Drawing Sheets

DAMASCENE ETCHBACK FOR LOW ε DIELECTRIC

FIELD OF THE INVENTION

The present invention relates to damascene processing and, in particular, to a method of providing a low dielectric constant, ε, material to an intermetal dielectric containing planarized in-laid wiring. The method of the present invention eliminates integration problems normally associated when materials having a low dielectric constant are to be used in conjunction with dielectric materials having a dielectric constant of 4.0 or higher. The present invention also relates to damascene structures, single and dual, which are produced using the method of the present invention. Since the method of the present invention is employed in fabricating damascene structures, the fabricated structures do not have any integration problems associated therewith. Moreover, the single and dual damascene structures of the present invention have reduced cross-talk and stray capacitance as compared to prior art damascene structures.

BACKGROUND OF THE INVENTION

Dual damascene is currently being used in sub-0.25 micron logic and 1-gigabyte dynamic random access memory (DRAM) cells and beyond technologies to reduce cost of ownership and improve via reliability. In addition, copper wiring is employed in sub-0.25 micron generation back end of the line (BEOL) wiring to reduce the wiring resistance and to meet the BEOL resistance capacitance (RC) delay performance requirements. The initial CMOS programs used $SiO_2$ as a dielectric material. However, as chip function integration increases, back end wiring densities also increase. Because of this, there exists a greater need for intralevel insulators having a dielectric constant lower than $Sio_2$. $SiO_2$ is presently the insulator of choice since the same has relatively good film properties.

The incorporation of low dielectric materials into wiring structures is crucial in order to reduce delays due to cross-talk and stray capacitance. Presently used $SiO_2$ has a relative dielectric constant of about 4, which limits its use because of potential cross-talk and RC delays.

Subsequent technologies will use dielectrics that have a lower dielectric constant than $SiO_2$ to reduce wiring capacitance and overall chip delay. In the past, integration of damascene structures into low dielectric constant materials has been difficult or nearly impossible due to the relatively poor film properties, e.g. hardness, adhesion, stability and stress, or the difficulty in the anisotropic etching of low dielectric constant dielectrics compared with $SiO_2$.

In view of the problems associated with integrating low dielectric constant dielectrics into damascene structures, there remains a need for providing a simple, yet effective method of fabricating damascene structures which contain a dielectric material, i.e. insulator, that has a lower dielectric constant than $SiO_2$. Such a method would eliminate the integration problems normally encountered in fabricating damascene wiring structures.

SUMMARY OF THE INVENTION

One object of the present invention is to provide a method of fabricating a damascene structure which contains a dielectric material having a dielectric constant lower than 4.0, i.e. the dielectric constant of $SiO_2$.

Another object of the present invention is to provide a simple, yet effective method of fabricating a damascene structure containing a dielectric material having a dielectric constant lower than $SiO_2$ which eliminates the integration problems normally associated with prior art processes.

A further object of the present invention is to provide a method of fabricating a damascene structure which has little or no delay problems caused by cross-talk or stray capacitance.

These as well as other objects and advantages are achieved in the present invention by etchingback the intermetal dielectric of a damascene structure so as to expose the in-laid wiring of said structure. Specifically, the foregoing objects are met by the method of the present invention which comprises the steps of:

(a) etching an intermetal dielectric of a damascene structure having planarized in-laid wiring, wherein said etching is carried out between said in-laid wiring so as to expose said in-laid wiring in said intermetal dielectric;

(b) forming a dielectric material having a dielectric constant lower than $SiO_2$ and the intermetal dielectric on said structure provided in step (a); and (c) planarizing the structure provided in step (b).

In an optional embodiment of the present invention, a polish stop layer is formed on the etchbacked structure provided in step (a) and thereafter steps (b) and (c) are performed. This optional embodiment is typically carried out when the low dielectric constant material is not compatible with the wiring material; or to act as a polish stop layer during the planarization step; or, if necessary, as a RIE stop during a subsequent via reactive ion etch (RIE) step.

In yet another optional embodiment of the present invention, a cap layer comprising a dielectric material such as $SiO_2$ or fluorinated $SiO_2$ is formed on the surface of the low dielectric constant material prior to planarizing the structure. This optional embodiment is typically employed when the low dielectric constant material is not compatible with the planarization step.

It is again noted that the above processing steps provide a dual or single damascene wiring structure. Dual damascene structures containing multiple wiring levels can also be obtained by providing a via and a metal line or alternatively a metal line and then a via to the planarized structure; filling with a metal and planarizing the line and via; and then repeating steps (a)–(c) above along with any of the above mentioned optional embodiments.

When a single damascene structure is desired, the method of the present invention is nearly identical to the method described above. It is noted that the single damascene embodiment may use a low dielectric constant dielectric for the wiring levels only and leave $SiO_2$ in the via level of the wiring levels or alternatively use a low dielectric constant dielectric for the via level only and leave $SiO_2$ in the wiring level. When a single damascene structure is desirable, it is also possible to use any of the optional embodiments described above.

In another aspect of the present invention, a damascene structure (both dual and single) containing a dielectric material having a dielectric constant lower than $SiO_2$ is provided. In accordance with this aspect of the present invention, the dual damascene structure comprises a planarized wiring structure having an upper and a lower wiring level, wherein said upper wiring level comprises an etchbacked intermetal dielectric, exposed in-laid wiring, an optional polish stop layer formed on said etched intermetal dielectric and said exposed in-laid wiring, a dielectric material having a dielectric constant lower than $SiO_2$ on said etchbacked structure or on said polish stop layer, and an optional cap layer on said low dielectric constant material. It is noted that the polish stop layer could also function as a diffusion barrier between the wiring and interlevel or intrametal dielectrics. In the case of the single damascene structure, an interconnect level is located between the wiring levels.

Damascene structures containing multiple wiring levels are also contemplated in the present invention. These damascene structures containing multiple wiring levels comprise alternating wiring levels and optional interconnect levels, between said wiring levels, wherein the intermetal dielectric of the various upper wiring levels are processed using steps (a)-(c) of the present invention.

It is noted that in the present invention, the initial dielectric material may be $SiO_2$ or it is also possible to use a material with a dielectric constant less than $SiO_2$ as the initial dielectric material. Likewise, this also applies to the optional cap layer which is deposited on top of the low dielectric constant dielectric. Thus, $SiO_2$ or alternatively a low dielectric constant dielectric which has a higher dielectric than the underlying low dielectric constant dielectric and is compatible with CMP may be employed in the present invention as the cap layer.

DETAILED DESCRIPTION OF THE INVENTION

Figure 1A:
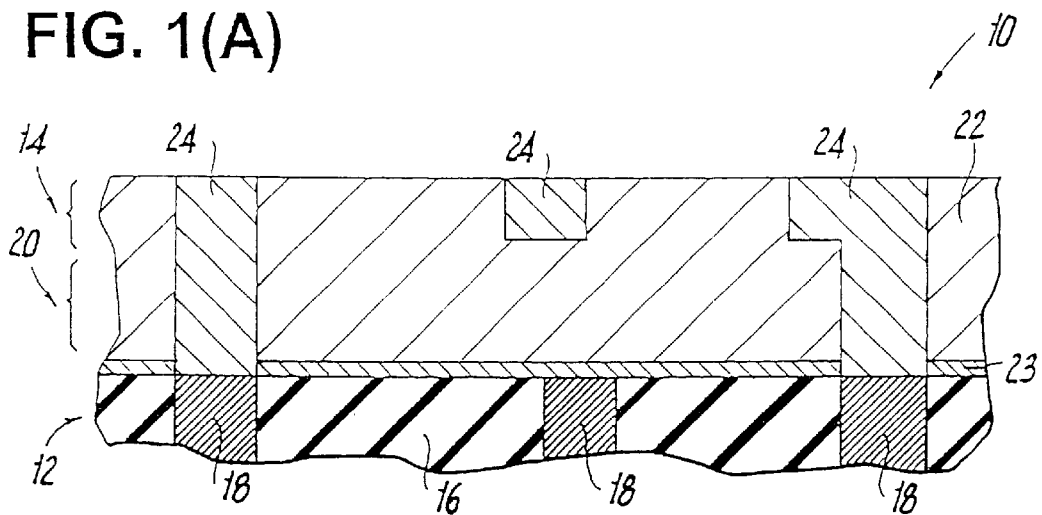
FIGS. 1(A)–(E) are cross-sections of a dual damascene structure prepared in accordance with the method of the present invention; (A) initial dual damascene structure; (B) structure after etchback; (C) etchbacked dual damascene structure containing an optional polish stop layer; (D) damascene structure of FIG. 1(C) after depositing a low dielectric constant material; and (E) final dual damascene after polishing FIG. 1(D).

The present invention, which relates to a method of fabricating a damascene structure containing a dielectric material having a dielectric constant lower than $SiO_2$, will now be described in greater detail by referring to the drawings that accompany this specification. It should be noted that in the drawings like elements or components are referred to by like numerals.

Referring to the drawings in more detail, and particularly referring to FIGS. 1(A)-(E), there is shown the various processing steps that are employed in the present invention for forming a dual damascene structure containing a dielectric material having a dielectric constant lower than $SiO_2$. integrated therein.

Specifically, FIG. 1(A) shows a typical dual damascene structure that can be employed in the present invention. The initial dual damascene structure 10 includes a lower wiring level 12, an upper wiring level 14 and a via level 20 which connects wiring levels 12 and 14. Lower wiring level 12 comprises an insulator material 16 and metal wires (or wiring) 18 which is filled with a conductive material or materials. Upper wiring level 14 of dual damascene structure 10 comprises an intermetal dielectric 22 and in-laid wiring 24 which is filled with a conductive material or materials. Via level 20 is seamlessly connected with wiring level 14 during the dual damascene process and is filled with a conductive material or materials 24. An optional dielectric RIE stop layer 23 may be used during the fabrication of the dual damascene via. The RIE stop layer may also function as a diffusion barrier or an adhesion promoter.

Dual damascene structure 10 of FIG. 1(A) is fabricated using techniques well known to those skilled in the art. For example, the dual damascene structure shown in FIG. 1(A) can be prepared in the following manner: After lower wiring level 12 is fabricated, a dielectric RIE stop layer 23 and intermetal dielectric 22 are deposited onto the wafer. Next, a trough for metal wiring level 14 is patterned and etched into intermetal dielectric 22. A dual damascene via 20 is patterned and etched through the wiring level trough down to the lower wiring level 12. Finally, the upper wiring level trough 14 and via 20 are filled with a conductor material and damascened into the intermetal dielectric 22. Alternatively, the via can be formed first followed by the upper wiring level. The metal lines and vias can be formed into the insulator material by using conventional lithographic techniques which include, but are not limited to: the resist patterning of insulator material 16; etching (reactive ion etching (RIE)) the unpatterned areas to provide metal lines; and stripping the resist.

The metal lines, i.e. wiring, and vias are filled with a conductive material using conventional deposition techniques, including but not limited to: chemical vapor deposition (CVD), sputtering, electro less deposition, electroplating, plasma vapor deposition and the like. Both wiring levels 12 and 14 are thereafter planarized by using any conventional planarization technique well known to those skilled in the art, including but not limited to: chemical-mechanical polishing (CMP) or RIE etchback. It should be understood that the lower wiring level shown in FIG. 1(A) only shows metal wires 18. The vias would be beneath the metal lines and are not shown in the drawings for clarity.

As stated above, upper wiring level 14 of dual damascene structure 10 is formed by depositing an optional barrier layer (RIE stop layer) 23 over planarized lower wiring level 12, opening predetermined regions of intermetal dielectric 22 and barrier layer 23, filling said opened regions with a conductive material to form in-laid wiring 24 and then planarizing upper wiring level 14. The upper wiring level includes a metal line and a via; the metal line; i.e. in-laid wiring 24, is the larger portion of inlaid metallurgy and via 20 is the narrower portion of the in-laid metallurgy which extends down to lower wiring level 12 of the structure. The various techniques used in forming upper wiring level 14 are the same as those used in forming lower wiring level 12.

In FIG. 1(A), insulator material 16 and intermetal dielectric 22 are formed of the same or different dielectric material. Typically, the dielectric material employed as insulator layer 16 and intermetal dielectric 22 is the same and it is a dielectric material than has a relative dielectric constant of about 3.5, preferably 4.0, or higher. Suitable dielectric materials that can be employed in the present invention as layers 16 and 22 include, but are not limited to: $SiO_2$, spin-on glasses, $Si_3N_4$, SiC and fluorinated $SiO_2$. Of these dielectric materials, it is preferred that insulator layer 16 and intermetal dielectric 22 of dual damascene structure 10 be both composed of $SiO_2$.

Barrier layer 23 is a material which serves as a RIE stop layer for via 20. Barrier layer 23 may also prevent diffusion between wire 18 and intermetal dielectric 22. Suitable materials for barrier layer 23 include, but are not limited to: $Si_3N_4$, SiC, hydrogenated $Si_3N_4$ and hydrogenated SiC. Of these materials, it is preferred to use the hydrogenated forms of $Si_3N_4$ or SiC in the present invention. This optional RIE stop layer may also be inserted between wiring level 14 and via level 20 (not shown in the drawings).

The conductive materials used in filling wires 18, in-laid wires 24 and via 20 may also be composed of the same or different conductive metals. Suitable conductive materials that can be employed in forming dual damascene structure 10 of FIG. 1(A) include metals such as, but not limited to: Cu, W, Cr, Al, Ag, Au, Ni and the like. Alloys containing one or more of these conductive metals are also contemplated herein.

It is again emphasized that the initial dual damascene structure shown in FIG. 1(A) is a conventional dual damascene wiring structure which is fabricated using techniques well known to those skilled in the art. The structures shown in FIGS. 1(B)–(E) and 2(A)–(B) show the various processing steps, including optional embodiments, that are employed in the present invention to integrate a dielectric material having a dielectric constant lower than 4.0 into dual damascene structure 10.

Figure 1B:
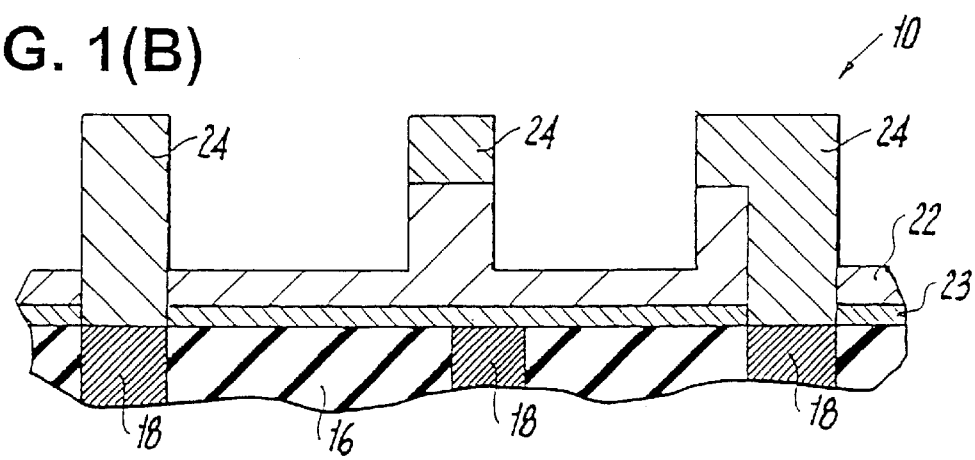

Specifically, the damascene structure of FIG. 1(A) is etched back using etching techniques and conditions that are sufficient to expose regions of in-laid wiring 24. The etchbacked structure is shown in FIG. 1(B). In accordance with the present invention, etching is carried out using an anisotropic or isotropic etch that is either non-corrosive to the conductive material found in in-laid wiring 24 or is capable of forming a surface oxide with the conductive material. Suitable anisotropic etching techniques that can be employed in the present invention to expose in-laid wiring 24 include dry etching techniques and/or wet chemical etching techniques, with dry reactive ion etching being the most preferred. The exact etching conditions vary depending on the specific etching technique employed. Since anisotropic etching techniques are well known to those skilled in the art, the conditions for etchingback intrametal dielectric 22 are also well known to those skilled in the art.

When dry etching is preformed, reactive ion etching (RIE), plasma etching and physical sputtering may be employed to expose in-laid wiring 24. Of these so-called dry etching techniques, it is highly preferred to use a fluorinated RIE process, using, for example, $CF_x$, $NF_x$ and $CH_xF_y$ as the active species. Typically, an oxygen source, such as $O_2$ NO or $NO_2$ and inert gases, such as Ar, $N_2$ or He, are also used.

The RIE etching is typically performed at pressure ranges from about 1 mTorr to about 1 Torr using a RF or microwave power density of from about 0.1 to about 100 $W/cm^2$.

When wet chemical etching is preformed in the present invention to expose regions of in-laid wiring 24, the chemical etchant employed may comprise HF, HCl, $HNO_3$ and like acids. Dilutions of these acids with water are also contemplated herein.

Figure 1C:
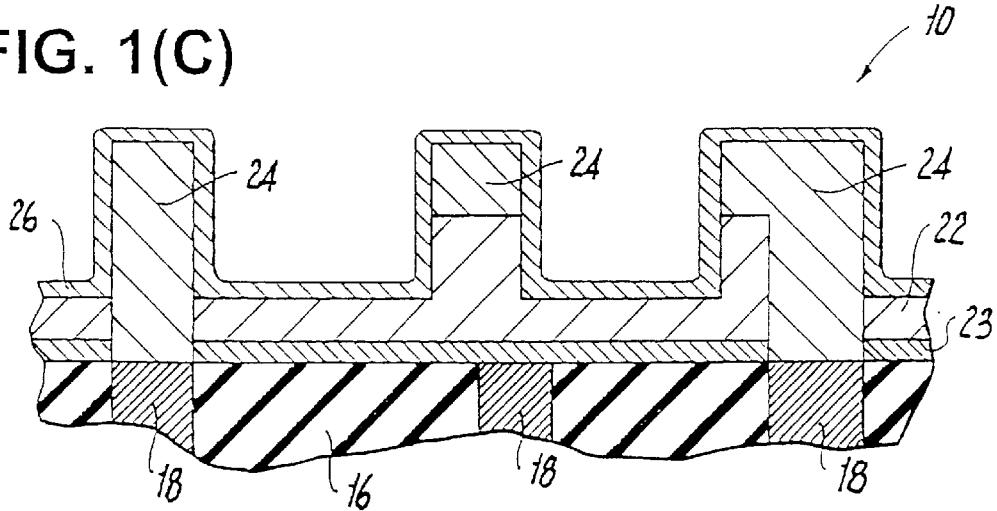

An optional step of the present invention, which is shown in FIG. 1(C), comprises depositing a polish stop layer 26 over the exposed regions of the structure shown in FIG. 1(B). Suitable materials that may be employed in the present invention to form polish stop layer 26 include, but are not limited to: $Si_3N_4$, SiC, $SiO_2$, amorphous carbon, hydrogenated $Si_3N_4$, hydrogenated SiC and the like. Of these materials, it is preferred in the present invention to use hydrogenated $Si_3N_4$ or SiC as the material for polish stop layer 26.

In embodiments wherein a polish stop layer is employed, polish stop layer 26 is deposited over etchback regions of intermetal dielectric 22 and exposed regions of in-laid wiring 24 using conventional deposition techniques well known to those skilled in the art. Suitable deposition techniques for depositing polish stop layer 26 include, but are not limited to: high density plasma CVD (HDPCVD), plasma enhanced CVD (PECVD), and physical vapor deposition. HDPCVD and PECVD are the preferred embodiments since they inherently minimize the deposition thickness on the sidewalls of exposed in-laid wiring 24.

The conditions employed in forming polish stop layer 26 vary depending on the type of deposition technique employed. In all instances, the deposition conditions employed must be capable of forming a polish stop layer having a thickness that is at least sufficient to act as a polish stop layer. In the present invention, this implies that the deposition conditions are effective in forming a polish stop layer that has a thickness of from about 10 to about 200 nm.

Figure 1D:
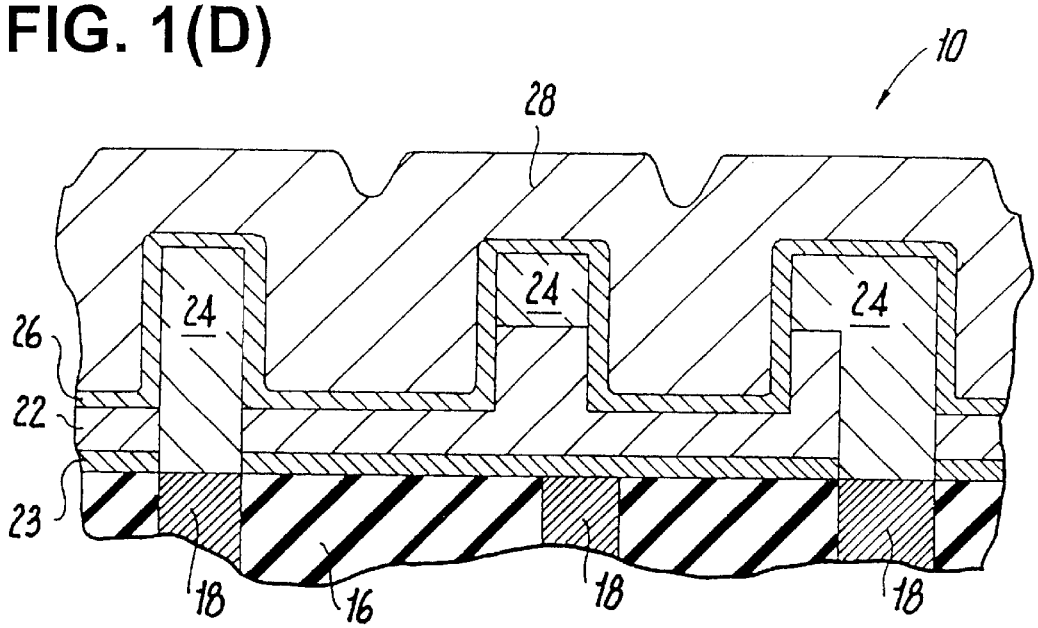

After etching back and depositing optional polish stop layer 26 to dual damascene structure 10, a dielectric material that has a relative dielectric constant lower than 4.0 is formed onto the etchback structure or optional polish stop layer 26 so as to form layer 28 as shown in FIG. 1(D). More specifically, this "low" dielectric constant material employed in this step of the present invention has a relative dielectric constant of from about 1.3 to about 3.5. Suitable dielectric materials that have a dielectric constant below 4.0 include, but are not limited to: amorphous carbon, fluorinated amorphous carbon, parylene, boron nitride, teflon, polynapthalene-N, polynapthalene-F, polyarylene ether, fluorinated polyamide, fluorocyclobutene, perfluorocyclobutene, benzocyclobutene, methylsilsequioxane, hydrosilsesquioxane, fluoropolymers, pourous dielectrics, polyamide nanofoam, silica aerogel and fully cyclized heterocyclic polymers.

The formation of low dielectric constant layer 28 is shown in FIG. 1(D). It should be emphasized that, in this figure and the remaining figures of FIG. 1, the optional polish stop layer is shown. It is, however, also within the contemplation of the present invention to omit polish stop layer 26.

The low dielectric constant materials used in forming layer 28 are deposited using techniques well known to those skilled in the art. The specific deposition technique normally varies depending on the type of material being used. For example, CVD methods including PECVD, HDPCVD, and ultra low temperature thermal CVD are used to deposit materials such as amorphous carbon, fluorinated amorphous carbon, parylene, etc.; and spin-on methods are used to deposit materials such as silica aerogel and hydrosilsesquioxane.

No matter which of these techniques is employed in depositing the layer of low dielectric constant material, i.e. layer 28, they must be capable of forming a low dielectric constant material layer that has a thickness of from about 10 to about 2000 nm. More preferable, layer 28 is formed under conditions sufficient to form a layer having a thickness of from about 200 to about 500 nm.

Figure 2A:
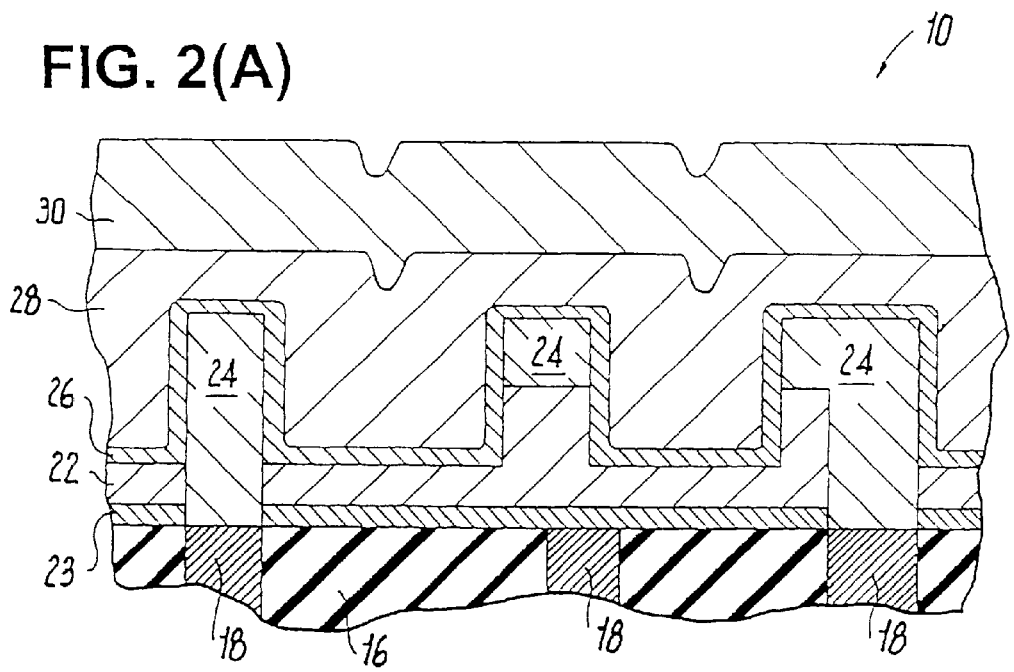
FIGS. 2(A)–(B) are cross-sectional views of the dual damascene structure of FIG. 1(D) after forming an optional cap layer on the structure; and (B) final damascene structure after polishing FIG. 2(A).

In another optional embodiment of the present invention, a cap layer 30 comprising a dielectric material may be formed on top of low dielectric constant layer 28 using deposition techniques well known to those skilled in the art such as PECVD. This embodiment of the present invention is shown in FIG. 2(A). Suitable dielectric cap materials include: $SiO_2$, fluorinated $SiO_2$, $Si_3N_4$, SiC, hydrogenated $Si_3N_4$ or hydrogenated SiC. Of these, $SiO_2$ or fluorinated $SiO_2$ are highly preferred as dielectric cap layer 30.

Figure 1E:
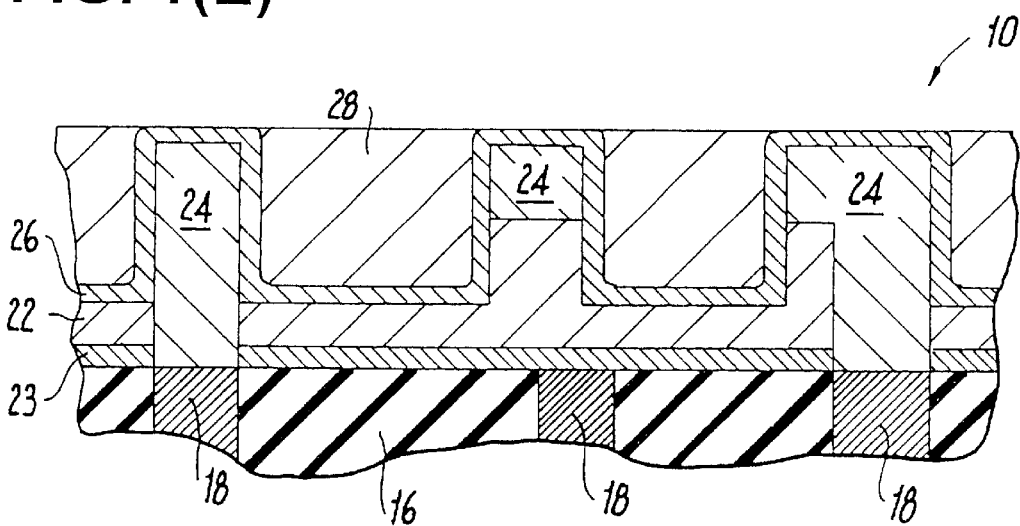
Figure 2B:
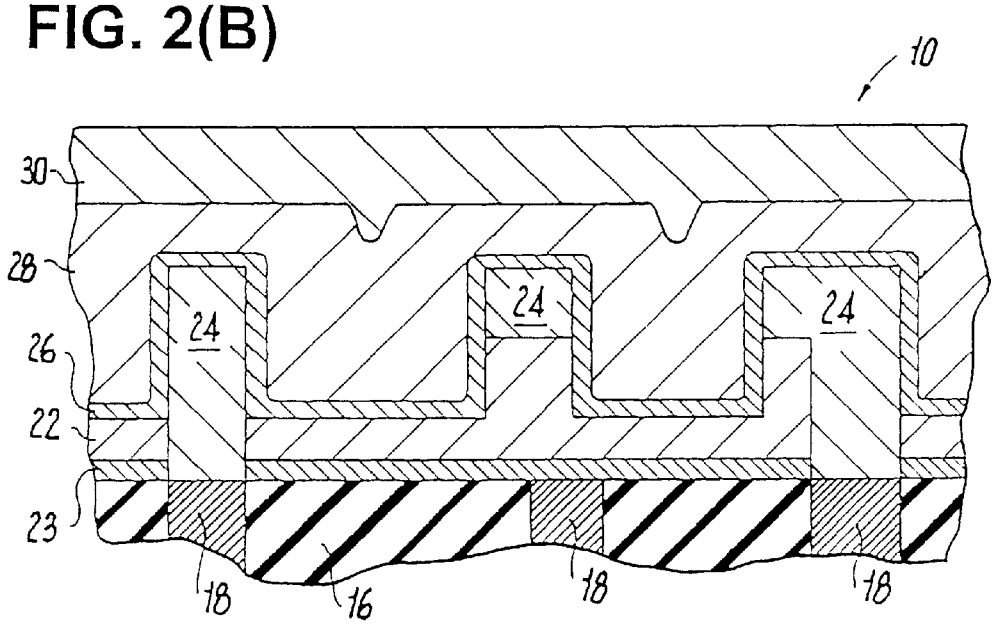

The final step employed in the present invention in forming the structures shown in FIG. 1(E) or FIG. 2(B) is a planarization step. In accordance with this step of the present invention, the dual damascene structures shown in FIG. 1(D) or FIG. 2(A) are then planarized using any of the aforementioned planarization techniques, with CMP being the most highly preferred planarization technique. The dual damascene structure may be planarized either above upper wiring level 14 leaving a thin layer of dielectric cap layer 30 in the final structure, as shown in FIG. 2(B) or to polish stop layer 26, as is shown in FIG. 1(E).

It is also possible to fabricate these structures with no planarization step, particularly for the last and next to last metal wiring level.

Figure 5A:
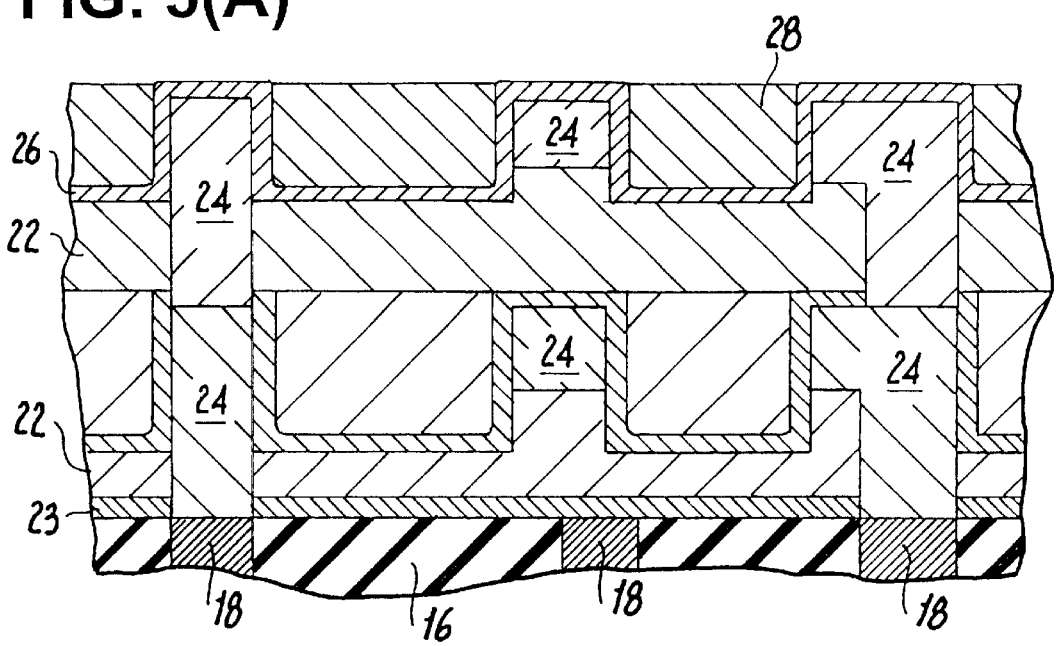
FIGS. 5(A)–(B) are cross-sectional views of a multiple dual damascene wiring structure of FIGS. 1(E)–2(B) respectively.
Figure 5B:
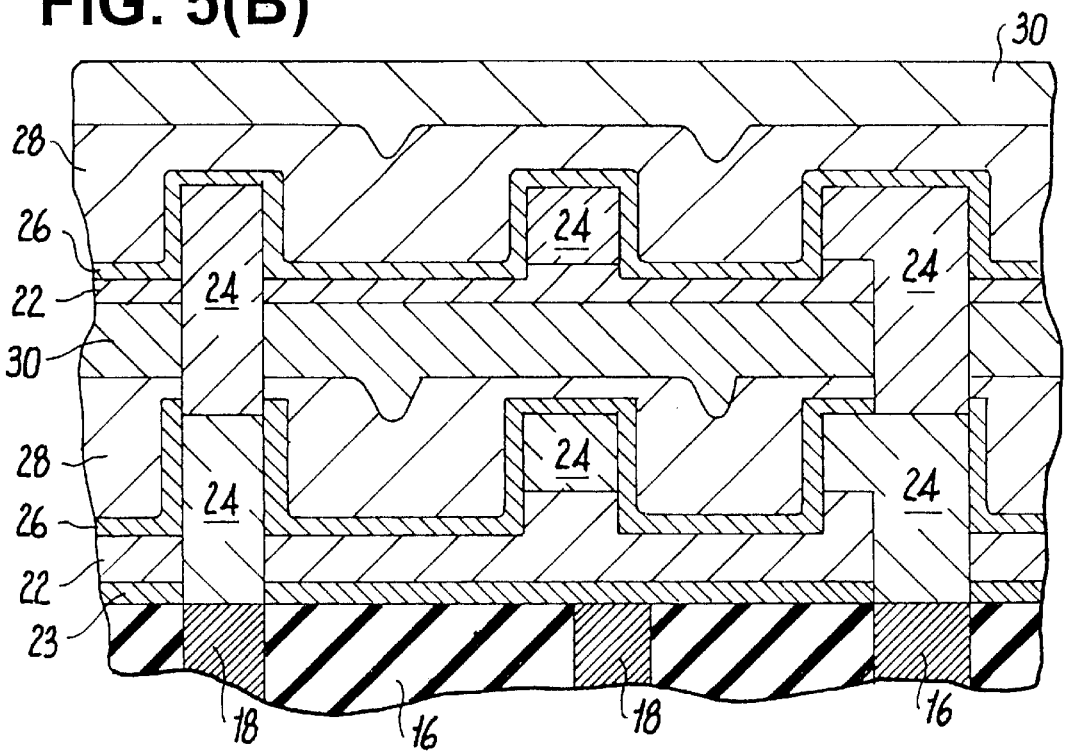
Figure 6A:
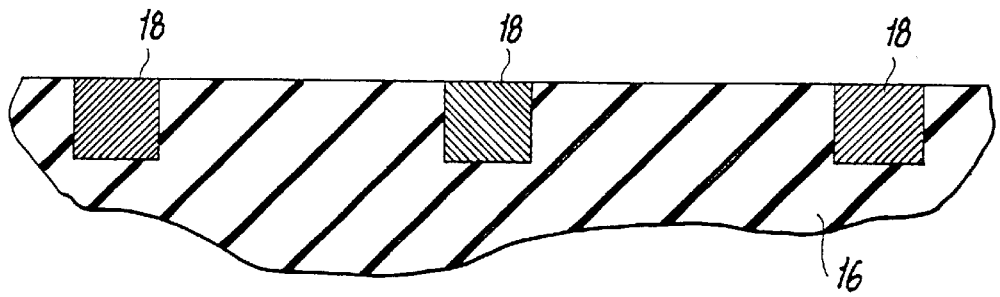
FIGS. 6(A)–6(H) are cross-sectional views of a dual damascene wiring structure prepared in accordance with an optional embodiment of the present invention.
Figure 6B:
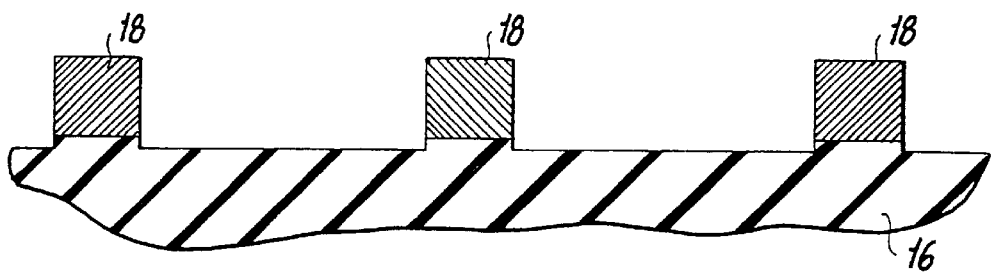
Figure 6C:
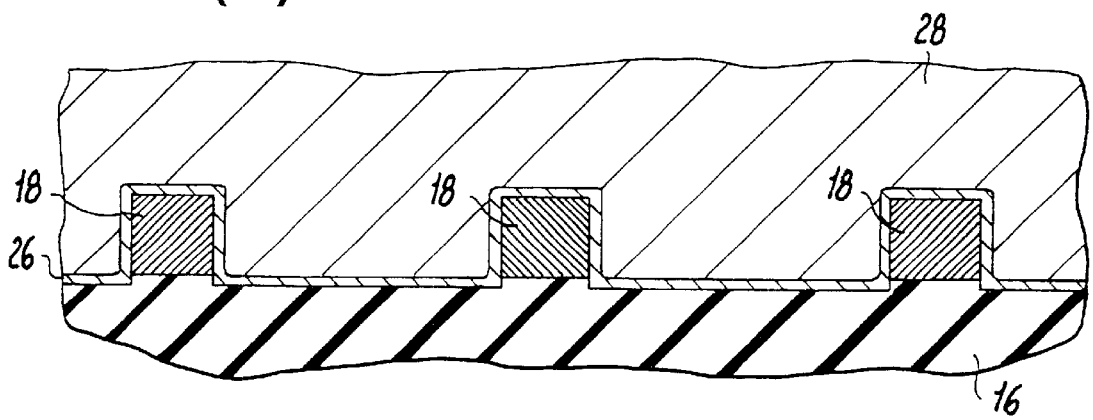
Figure 6D:
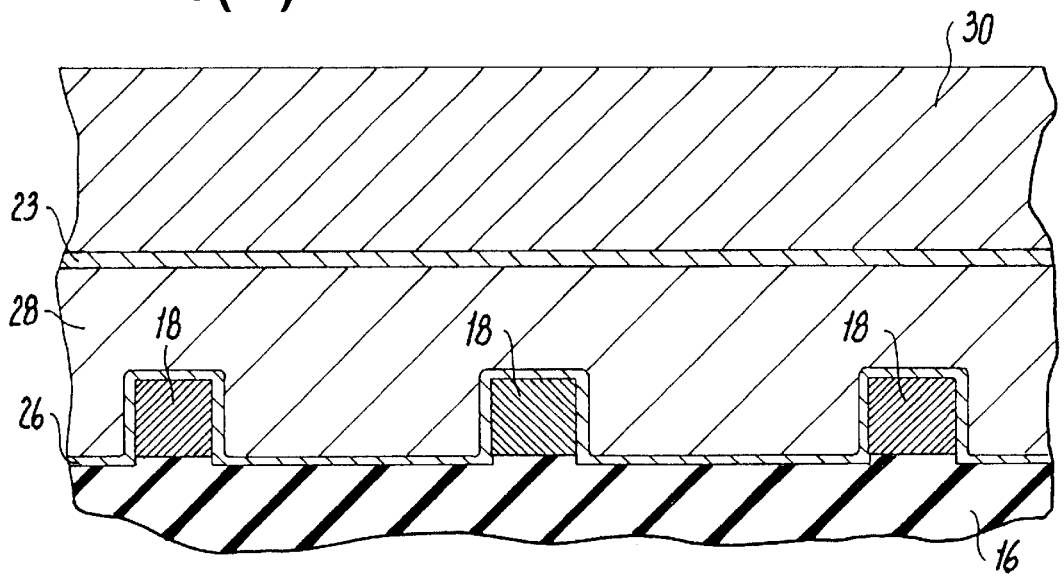
Figure 6E:
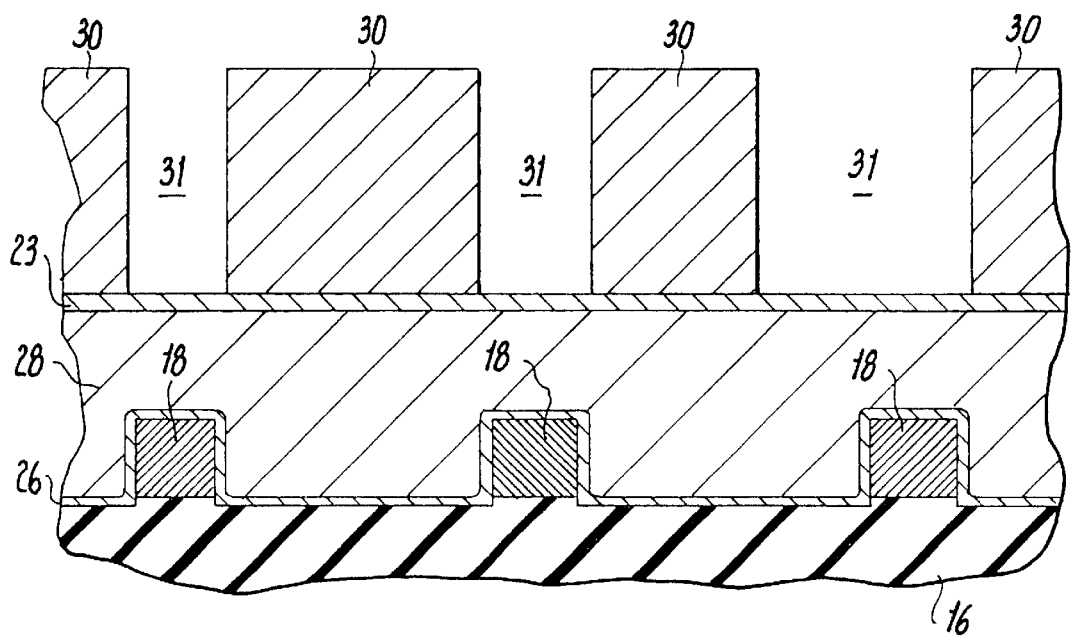
Figure 6F:
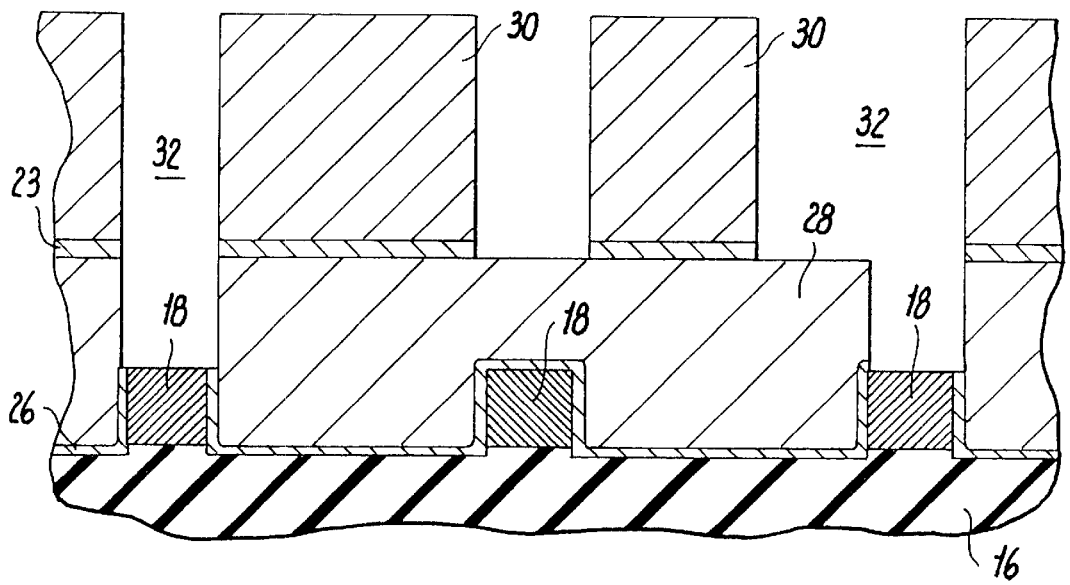
Figure 6G:
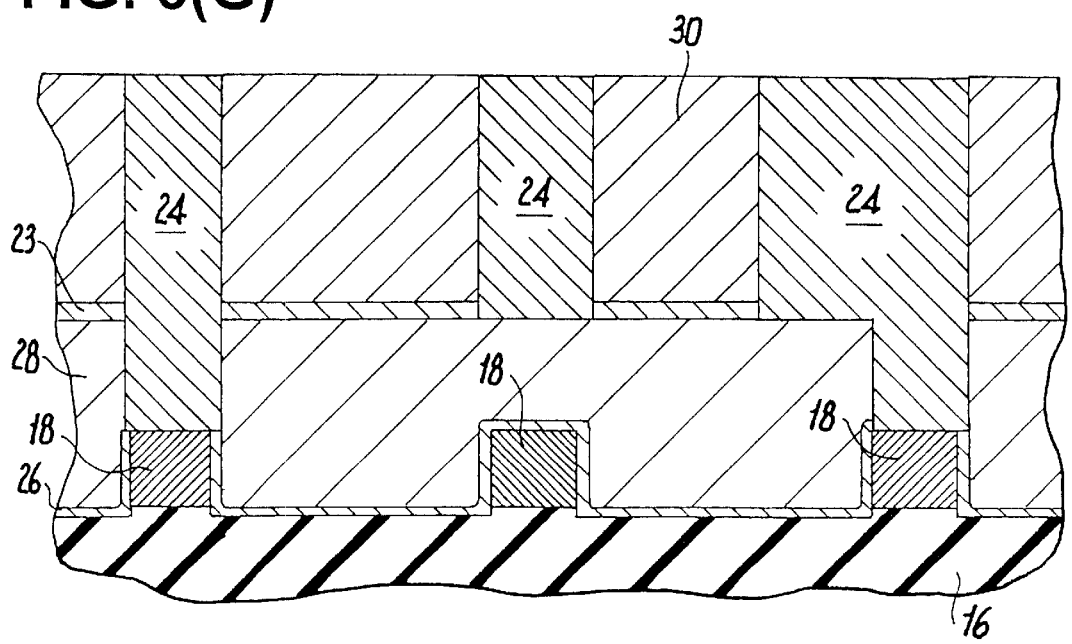
Figure 6H:
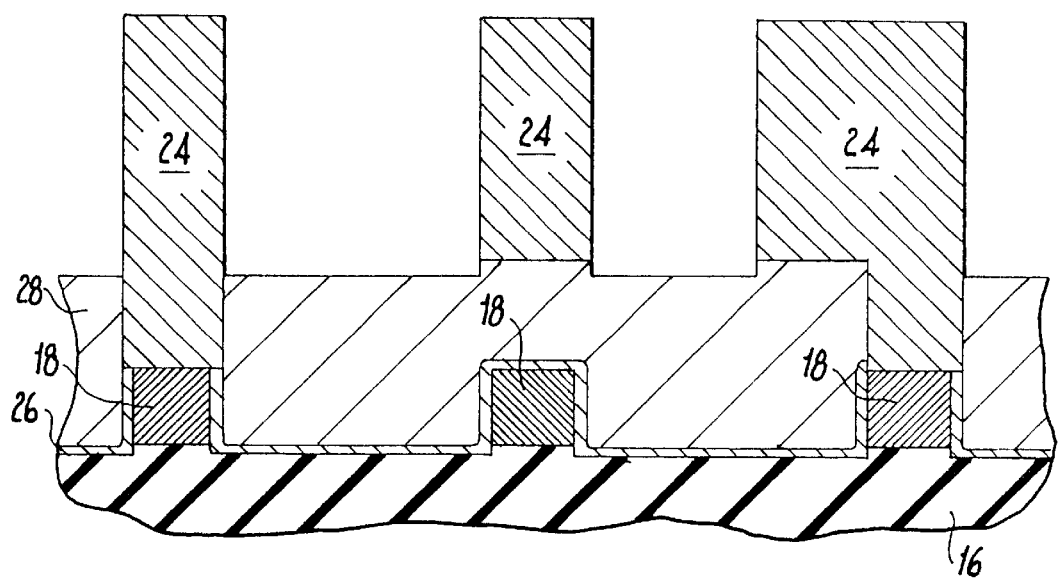
Figure 7A:
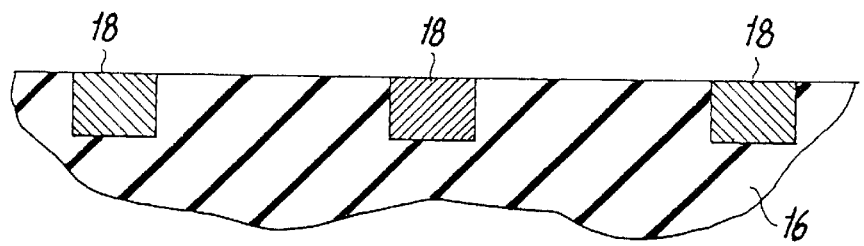
FIGS. 7(A)–7(G) are cross-sectional views of a single damascene version of the dual damascene wiring structure of FIGS. 6(A)–6(H).
Figure 7B:
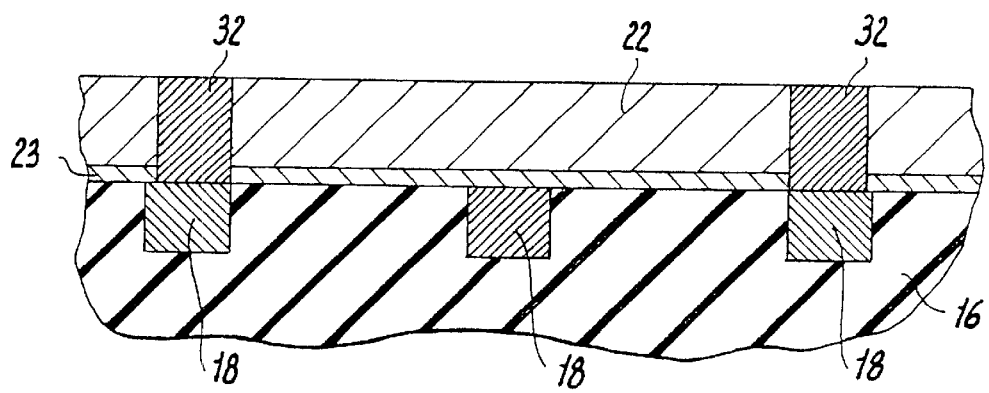
Figure 7C:
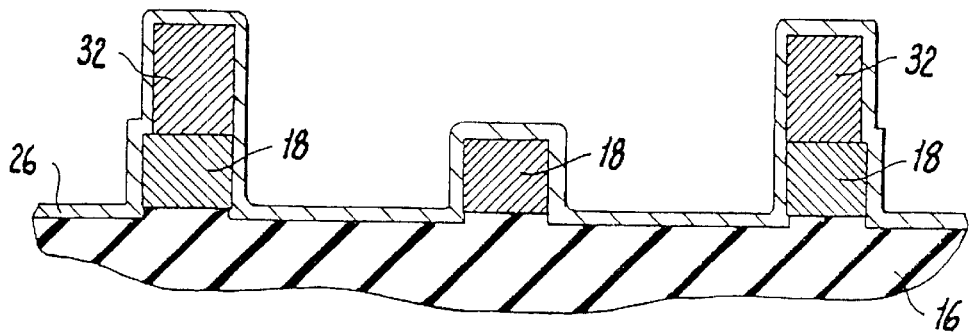
Figure 7D:
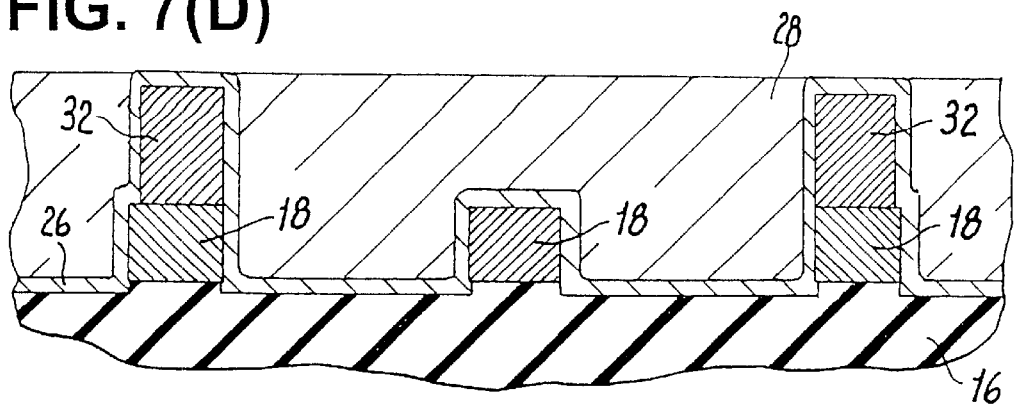
Figure 7E:
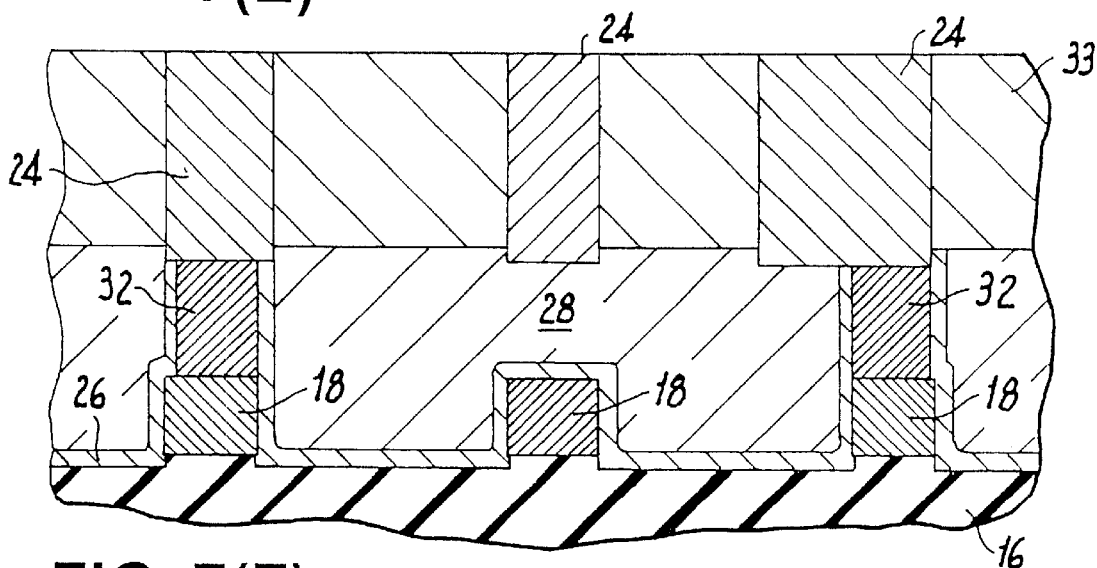
Figure 7F:
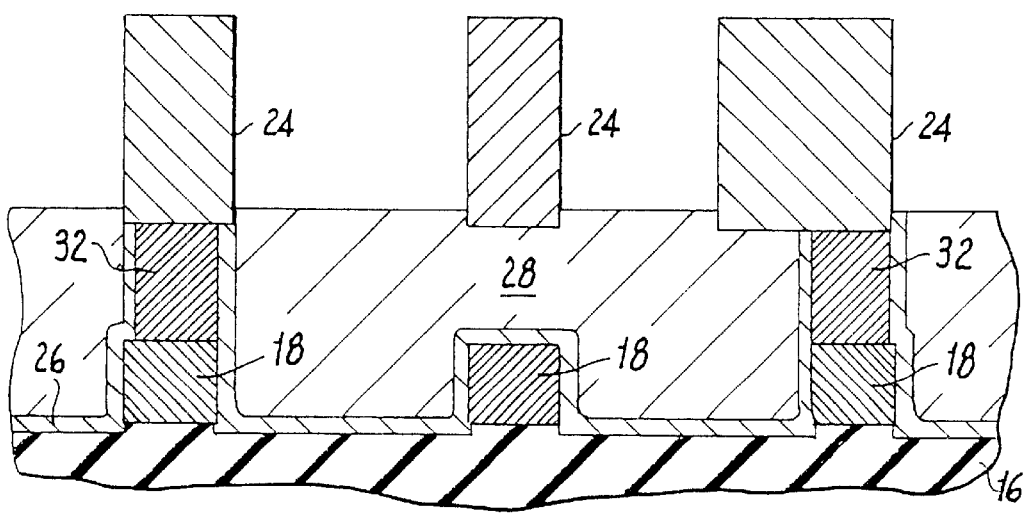
Figure 7G:
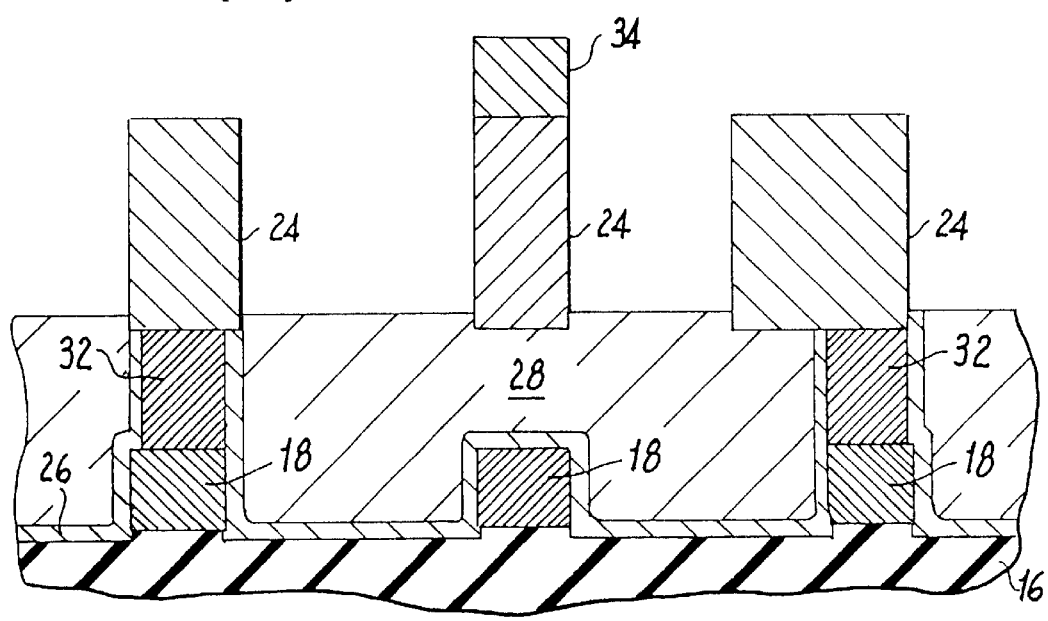

It is emphasized that both FIGS. 1(E) and 2(B) illustrate, dual damascene wiring structures that can be fabricated by the method of the present invention. Dual damascene wiring structures containing multiple wiring levels are also contemplated. The multiple dual damascene wiring structures are fabricated by first forming a structure as shown in FIG. 1(A) to either of the dual damascene structures shown in FIGS. 1(E) and 2(B) and then repeating the steps of the present invention. Such structures are shown in FIGS. 5(A) and (B), respectively.

The above method provides an effective means of integrating a dielectric material having a dielectric constant lower than $SiO_2$ (<4.0) into a dual damascene wiring structure. Moreover, the damascene structures fabricated by the method of the present invention have little or no delay problems which are normally caused by cross-talk or stray capacitance.

Figure 3A:
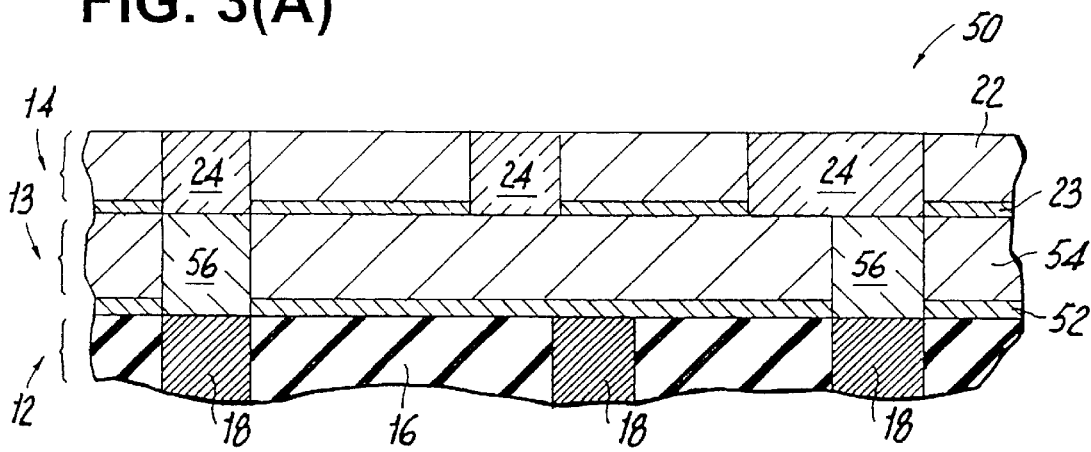
FIGS. 3(A)–(E) are cross-sectional views of a single damascene structure prepared in accordance with the method of the present invention; (A) initial single damascene structure; (B) structure after etchback; (C) etchbacked structure containing an optional polish stop layer; (D) structure of FIG. 3(C) after depositing a low dielectric constant material; and (E) final structure after polishing.

In addition to the dual damascene structures, the present invention also contemplates the use of a single damascene structure. This aspect of the present invention is shown in FIGS. 3(A)-(E) and in FIGS. 4(A) and (B). Specifically, FIG. 3(A) shows a typically single damascene structure that can be employed in the present invention. As is shown, single damascene 50 comprises upper wiring level 14, via interconnect level 13, lower wiring level 12 (in this drawing the wire of the lower wiring level is shown). The components of the wiring levels are the same as that described herein above for the dual damascene structure. Via interconnect level 13 includes an etch stop barrier layer 52; a dielectric material layer 54 and conductive studs 56. Barrier layer 52, dielectric material layer 54 and conductive studs 56 are composed of the same or different materials as barrier layer 23, insulator material 16 and wiring 18, respectively.

The interconnect is formed by forming barrier 52 on the surface of the via level or metal line of lower wiring level 12, depositing dielectric material 54, opening vias in dielectric material 54 and barrier layer 52 so as to expose the underlying conductive material of via level 12, filling the vias with conductive studs 56; and planarizing the structure.

Figure 3B:
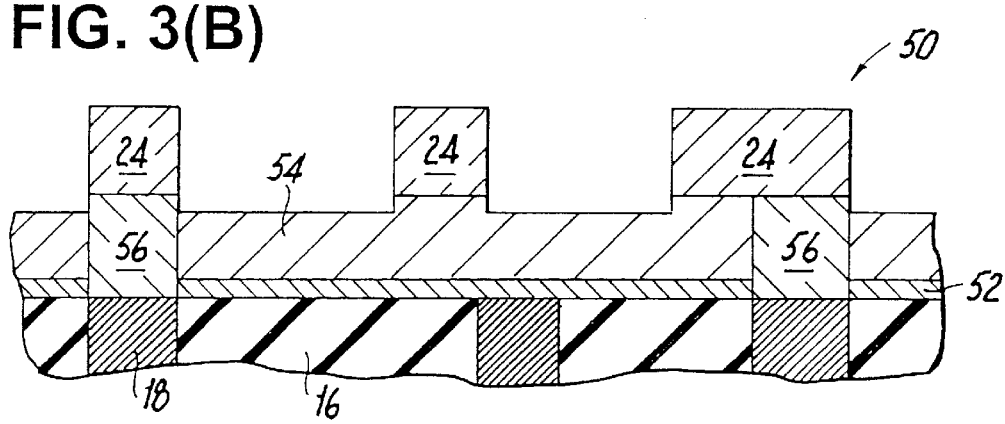
Figure 3C:
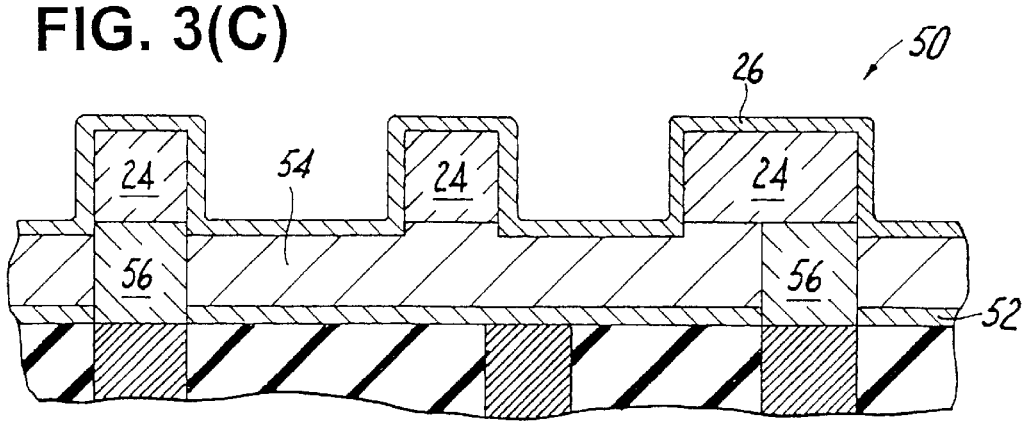
Figure 3D:
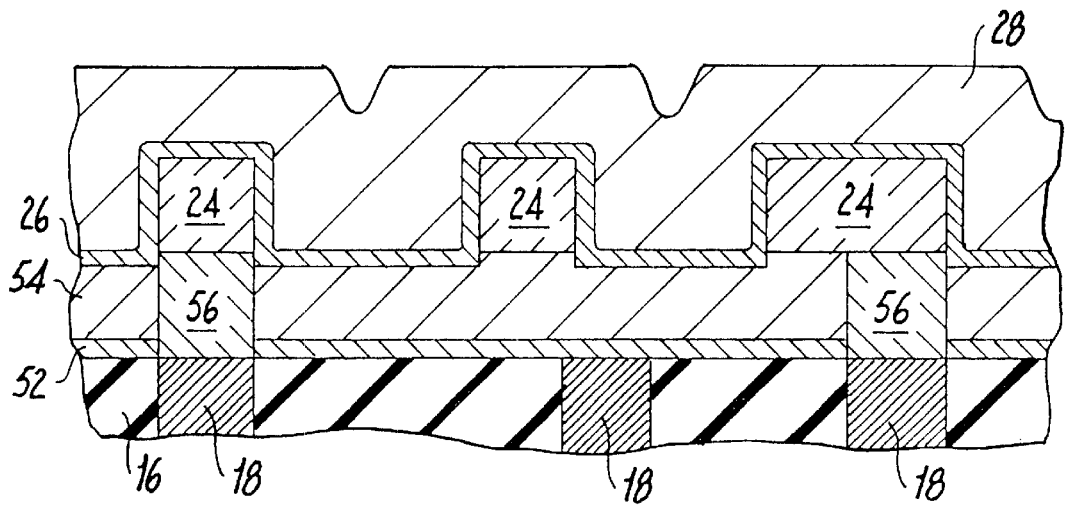
Figure 3E:
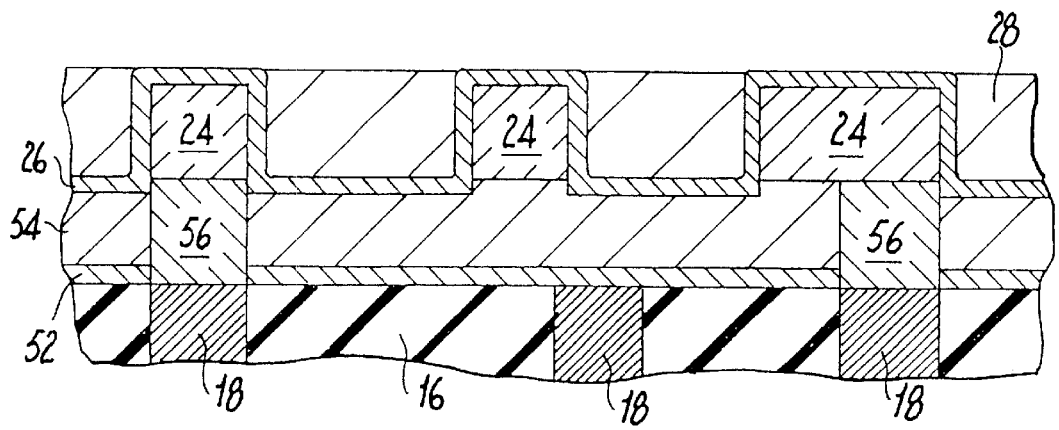
Figure 4A:
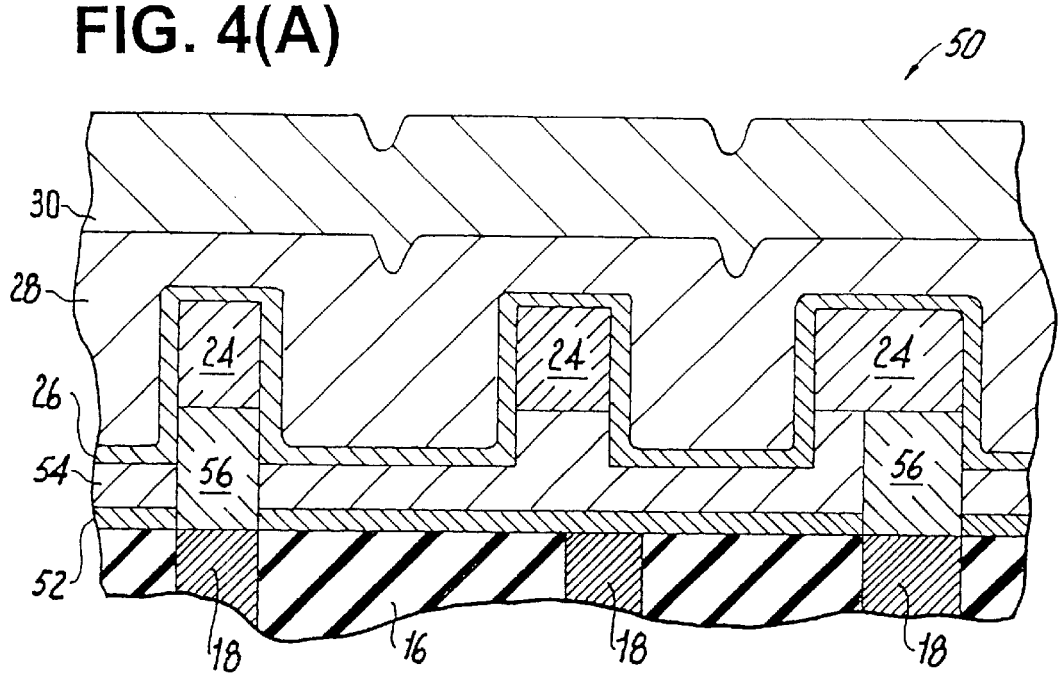
FIGS. 4(A)–(B) are cross-sectional views of the single damascene structure of FIG. 3(D) after depositing an optional cap layer on the structure; and (G) final structure after polishing.
Figure 4B:
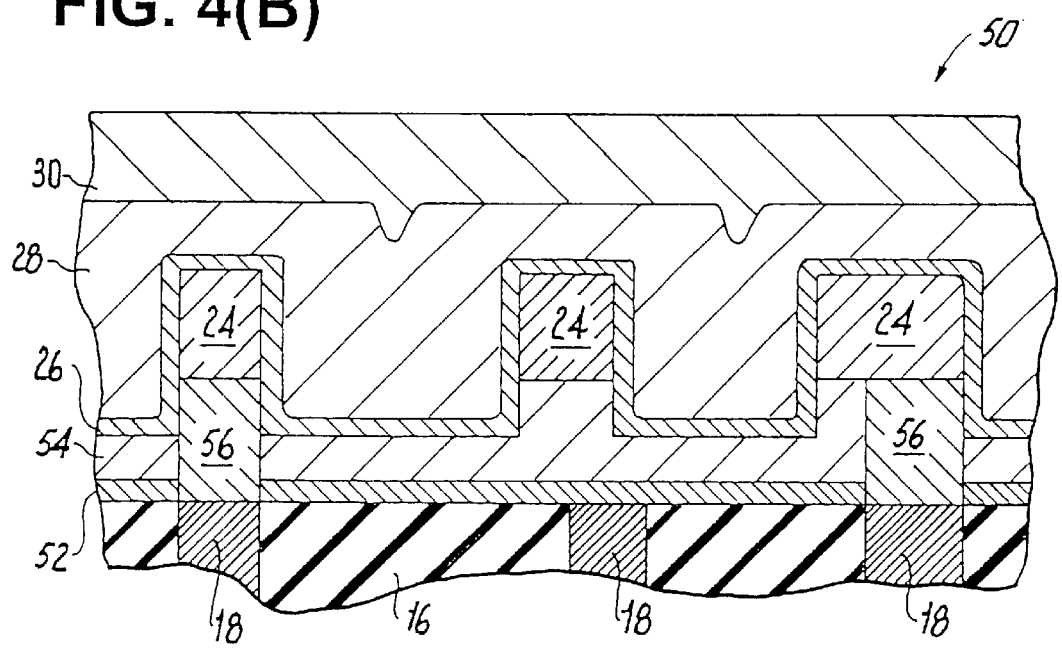

The remaining drawings of FIG. 3 are identical to those in FIG. 1 except that during the etchback process, as is shown in FIG. 3(B), barrier layer 23, which in this case is a sacrificial layer, may or may not be removed along with intrametal dielectric 22. Removing the barrier layer and etching into dielectric 54 is the preferred embodiment. The etchbacked structure is then, processed as described above. FIGS. 4(A)–(B) show the optional embodiment wherein a dielectric cap layer 30 is employed.

It is also possible to provide single damascene structures which contain multiple wiring and via levels. Such structures would be nearly identical to those shown in FIGS. 5(A) and (B).

If barrier layer 23 is used in either single or dual damascene processes, then it would be possible to use it as an etch stop for etchback shown in FIGS. 1(b) and 3(b).

While the invention has been particularly shown and described with respect to preferred embodiments thereof, it will be understood by those skilled in the art that the foregoing and other changes in form and details may be made therein without departing from the spirit and scope of the present invention.

Another optional embodiment of the present invention is shown in FIG. 6. This dual damascene embodiment has the advantage of eliminating the initial $SiO_2$ film between the damascene metal wires and vias. In this embodiment; wires 18 are damascened into $SiO_2$ 16 (FIG. 6a); the $SiO_2$ is etched back (FIG. 6b); an optional etch stop 26 followed by a low k dielectric 28 is deposited (FIG. 6c), the low k dielectric 28 is planarized by using CMP and capped with an etch stop 23 and $SiO_2$ 30 (FIG. 6d); metal wire troughs 31 are patterned and etched into the $SiO_2$ 30 (FIG. 6e); vias 32 are patterned and etched through the etch stop 23, low k dielectric 28, and optional etch stop 26 (FIG. 6f); metal is damascened into the troughs 30 and vias 31 (FIG. 6g); and the etchback process is repeated (FIG. 6h).

A single damascene version of the dual damascene FIG. 6 embodiment is shown in FIG. 7. In this embodiment wires 18 are damascened into $SiO_2$ 16 (FIG. 7a); an etch stop 23 followed by $SiO_2$ 22 is deposited and vias 32 are patterned, etched, and metallized (FIG. 7b); the dielectric films 16, 23, and 22 are etched back and an optional etch stop 26 is deposited (FIG. 7c); low k dielectric 28 is deposited and planarized (FIG. 7d); $SiO_2$ 33 is deposited and metal wires 24 are patterned, etched, and metallized (FIG. 7e); an etched stop 23 and $SiO_2$ film 22 are deposited and vias 34 are patterned, etched, and metallized (FIG. 7f); finally the etchback process is repeated (FIG. 7f). A etch stop film, such as $Si_3N_4$, could be deposited between films 28 and 33 (FIG. 7e) if desired to act as a RIE stop for the metal wire trough 24.

Another optional embodiment of this invention would be to fabricate the single or dual damascene wires using photoresist as the dielectric. The photoresist would be removed using standard oxygen or ozone resist strip processes after the wires and vias were planarized. This approach has the advantage that the wires and vias would not need to be etched into a dielectric.

What is claimed is:

1. A method of providing a low dielectric constant material to a damascene structure containing an intermetal dielectric having planarized in-laid wiring comprising the steps of:

(a) partially etching back an intermetal dielectric of a damascene structure having planarized in-laid wiring, said intermetal dielectric is formed on an etch stop layer that includes openings in which said planarized in-laid wiring is in electrical contact with wiring regions of a lower wiring level, so as to expose a portion of said in-laid wiring, wherein said etching back is stopped before reaching said etch stop layer;

(b) forming a dielectric material having a dielectric constant lower than $SiO_2$ and the intermetal dielectric on said partially etched intermetal dielectric; and (c) planarizing the structure provided in step (b).

2. The method of claim 1 wherein prior to conducting said etching step a dual damascene structure is provided.

3. The method of claim 2 wherein said dual damascene structure includes an upper wiring level and a lower wiring level.

4. The method of claim 3 wherein said lower wiring level comprises an insulator material having at least one via and metal line both filled with a conductive metal.

5. The method of claim 3 wherein said upper wiring level comprises said semiconductor substrate having said, planarized in-laid wiring.

6. The method of claim 1 wherein said etching is carried out using an anisotropic or isotropic etch.

7. The method of claim 6 wherein said anisotropic etch is carried out by dry etching, wet chemical etching or a combination thereof.

8. The method of claim 7 wherein said dry etching includes reactive ion etching (RIE), plasma etching or physical sputtering.

9. The method of claim 8 wherein said dry etching comprises a fluorinated RIE process using an active species selected from the group consisting of $CF_x$, $NF_x$ and $CH_xF_y$.

10. The method of claim 7 wherein said wet chemical etching includes the use of a chemical etchant selected from the group consisting of HF, HCl, $HNO_3$ and aqueous mixtures thereof.

11. The method of claim 1 wherein said intermetal dielectric has a relative dielectric constant of 3.5 or above.

12. The method of claim 11 wherein said intermetal dielectric is selected from the group consisting of $SiO_2$, spin on glasses, $Si_3N_4$, SiC and fluorinated $SiO_2$.

13. The method of claim 12 wherein said intermetal dielectric is $SiO_2$ or fluorinated $SiO_2$.

14. The method of claim 1 further comprising depositing a polish stop layer over said etched intermetal dielectric and said exposed in-laid wiring prior to conducting step (b).

15. The method of claim 14 wherein said polish stop layer is a material selected from the group consisting of $Si_3N_4$, SiC, amorphous carbon, hydrogenated $Si_3N_4$ and hydrogenated SiC.

16. The method of claim 14 wherein said polish stop layer is deposited by high density plasma chemical vapor deposition (HDPCVD), plasma enhanced chemical vapor deposition (PECVD), physical vapor deposition (PVD) or other like deposition techniques.

17. The method of claim 14 wherein said polish stop layer has a thickness after said depositing of from about 10 to about 200 nm.

18. The method of claim 1 wherein said low dielectric constant material is selected from the group consisting of amorphous carbon, fluorinated amorphous carbon, parylene, boron nitride, teflon, polynapthalene-N, polynapthalene-F, polyarylene ether, fluorinated polyamide, fluorocyclobutene, perfluorocyclobutene, benzocyclobutene, methylsilsequioxane, hydrosilsesquioxane, fluoropolymers, pourous dielectrics, polyamide nanofoam, silica aerogel and fully cyclized heterocyclic polymers.

19. The method of claim 1 wherein said low dielectric material is formed by chemical vapor deposition or spin-coating.

20. The method of claim 1 wherein said low dielectric constant material has a thickness after said depositing of from about 10 to about 2000 nm.

21. The method of claim 20 wherein said low dielectric constant material has a thickness of from about 200 to about 500 nm.

22. The method of claim 1 wherein, prior to conducting step (c), a dielectric cap layer is deposited on said low dielectric material.

23. The method of claim 22 wherein said dielectric cap layer is $SiO_2$, fluorinated $SiO_2$, $Si_3N_4$, SiC, hydrogenated $Si_3N_4$ or hydrogenated SiC.

24. The method of claim 1 wherein said planarization step includes chemical-mechanical polish (CMP) or chemical polish.

25. The method of claim 24 wherein said planarization step includes CMP.

26. The method of claim 1 wherein said damascene structure is a single damascene structure having a lower wiring level, a via interconnect level, and an upper wiring level.

27. The method of claim 26 wherein each of said levels is separated by a barrier layer.

28. The method of claim 27 wherein said barrier level of said upper wiring level is etched during step (a).

29. A method of providing a low dielectric constant material to a damascene structure containing an intermetal dielectric having planarized in-laid wiring comprising the steps of:

(a) partially etching back an intermetal dielectric of a damascene structure having planarized in-laid wiring, said intermetal dielectric is formed on an etch stop layer that includes openings in which said planarized in-laid wiring is in electrical contact with wiring regions of a lower wiring level, so as to expose a portion of said in-laid wiring, wherein said etching back is stopped before reaching said etch stop layer;

(b) forming a polish stop layer over said partially etched back intermetal dielectric;

(c) forming a dielectric material having a dielectric constant lower than $SiO_2$ and the intermetal dielectric over the polish stop layer; and (d) planarizing the structure providing in step (c) stopping on an uppermost exposed surface of said polish stop layer.

30. The method of claim 29 wherein prior to conducting said etching step a dual damascene structure is provided.

31. The method of claim 30 wherein said dual damascene structure includes an upper wiring level and a lower wiring level.

32. The method of claim 31 wherein said lower wiring level comprises an insulator material having at least one via and metal line both filled with a conductive metal.

33. The method of claim 31 wherein said upper wiring level comprises a semiconductor substrate having said planarized in-laid wiring.

34. The method of claim 29 wherein said etching is carried out using an anisotropic or isotropic etch.

35. The method of claim 34 wherein said anisotropic etch is carried out by dry etching, wet chemical etching or a combination thereof.

36. The method of claim 35 wherein said dry etching is carried out by reactive ion etching (RIE), plasma etching or physical sputtering.

37. The method of claim 36 wherein said dry etching comprises a flurinated RIE process using an active species selected from the group consisting of $CF_x$, $NF_x$ and $CH_xF_y$.

38. The method of claim 35 wherein said wet chemical etching comprises the use of a chemical etchant selected from the group consisting of HF, $HC_1$, $HNO_3$ and aqueous mixtures thereof.

39. The method of claim 29 wherein said intermetal dielectric has a relative dielectric constant of 3.5 or above.

40. The method of claim 39 wherein said intermetal dielectric is selected from the group consisting of $SiO_2$, spin on glasses, $Si_3N_4$, SiC and fluorinated $SiO_2$.

41. The method of claim 29 wherein said intermetal dielectric is $SiO_2$ or fluorinated $SiO_2$.

42. The method of claim 29 wherein said polish stop layer is a material selected form the group consisting of $Si_3N_4$, SiC, amorphous carbon, hydrogenated $Si_3N_4$ and hydrogenated SiC.

43. The method of claim 29 wherein said low dielectric constant material is selected from the group consisting of amorphous carbon, fluorinated amorphous carbon, parylene, boron nitride, teflon, polynapthalene-N, polynapthalene-F, polyarylene ether, fluorinated polyimide, fluorocyclobutene, perfluorocyclobutene, benzocyclobutene, methylsilsequioxane, hydrosilsesquioxane, fluorpolymers, pourous dielectrics, polyimide nanofoam, silica aerogel and fully cyclized heterocyclic polymers.

44. The method of claim 29 wherein, prior to conducting step (d), a dielectric cap layer is deposited on said low dielectric material.

45. The method of claim 44 wherein said dielectric cap layer is $SiO_2$, fluorinated $SiO_2$, $Si_3N_4$, SiC, hydrogenated $Si_3N_4$ or hydrogenated SiC.

46. The method of claim 29 wherein said planarization step includes chemical-mechanical polish (CMP) or chemical polish.

47. A method of providing a low dielectric constant material to a damascene structure containing an intermetal dielectric having planarized in-laid wiring comprising the steps of:

(a) partially etching back an intermetal dielectric of a damascene structure having planarized in-laid wiring, said intermetal dielectric is formed on an etch stop layer that includes openings in which said planarized in-laid wiring is in electrical contact with wiring regions of a lower wiring level, so as to expose a portion of said in-laid wiring, wherein said etching back is stopped before reaching said etch stop layer;

(b) forming a polish stop layer over said partially etched back intermetal dielectric;

(c) forming a dielectric material having a dielectric constant lower than $SiO_2$ and the intermetal dielectric over the polish stop layer; and (d) planarizing the structure providing in step (c) so as to leave some of said dielectric material that is above the polish stop layer in said structure.

* * * * *